United States Patent
Su et al.

(10) Patent No.: US 11,489,064 B2
(45) Date of Patent: *Nov. 1, 2022

(54) FORMING 3D TRANSISTORS USING 2D VAN PER WAALS MATERIALS

(71) Applicant: Taiwan Semiconductor Manufacturing Company, Ltd., Hsinchu (TW)

(72) Inventors: Sheng-Kai Su, Hsinchu (TW); Jin Cai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 25 days.

This patent is subject to a terminal disclaimer.

(21) Appl. No.: 16/883,271

(22) Filed: May 26, 2020

(65) Prior Publication Data

US 2021/0184020 A1 Jun. 17, 2021

Related U.S. Application Data

(60) Provisional application No. 62/947,864, filed on Dec. 13, 2019.

(51) Int. Cl.
*H01L 29/66* (2006.01)
*H01L 29/786* (2006.01)
*H01L 29/24* (2006.01)

(52) U.S. Cl.
CPC ....... *H01L 29/66969* (2013.01); *H01L 29/24* (2013.01); *H01L 29/78696* (2013.01)

(58) Field of Classification Search
CPC ....... H01L 29/41791; H01L 29/66795–66818; H01L 29/785–7856; H01L 29/1037; H01L 29/66969; H01L 29/78681; H01L 29/78696
See application file for complete search history.

(56) References Cited

U.S. PATENT DOCUMENTS

| 9,257,508 B2 | 2/2016 | Lee et al. |
| 10,269,791 B2 | 4/2019 | Yeo et al. |
| 10,741,659 B2 | 8/2020 | Yoon et al. |

(Continued)

FOREIGN PATENT DOCUMENTS

| KR | 20130086808 A | 8/2013 |
| KR | 20190077917 A | 7/2019 |

(Continued)

*Primary Examiner* — Vincent Wall
(74) *Attorney, Agent, or Firm* — Slater Matsil, LLP

(57) ABSTRACT

A method includes etching a dielectric layer to form a dielectric fin, depositing a transition metal dichalcogenide layer on the dielectric fin, and performing an anisotropic etching process on the transition metal dichalcogenide layer. Horizontal portions of the transition metal dichalcogenide layer are removed, and vertical portions of the transition metal dichalcogenide layer on sidewalls of the dielectric fin remain to form a vertical semiconductor ring. The method further includes forming a gate stack on a first portion of the two-dimensional semiconductor vertical semiconductor ring, and forming a source/drain contact plug, wherein the source/drain contact plug contacts sidewalls of a second portion of the vertical semiconductor ring.

20 Claims, 16 Drawing Sheets

(56) References Cited

U.S. PATENT DOCUMENTS

| | | | |
|---|---|---|---|
| 2007/0111435 A1* | 5/2007 | Kim | H01L 29/66795 |
| | | | 438/253 |
| 2013/0270638 A1 | 10/2013 | Adam et al. | |
| 2015/0364592 A1* | 12/2015 | van Dal | H01L 29/66795 |
| | | | 257/29 |
| 2016/0300908 A1* | 10/2016 | Heo | H01L 29/42384 |
| 2018/0197957 A1 | 7/2018 | Maeda et al. | |
| 2019/0074381 A1* | 3/2019 | Park | H01L 29/86 |
| 2019/0198638 A1 | 6/2019 | Van Houdt et al. | |

FOREIGN PATENT DOCUMENTS

| | | |
|---|---|---|
| KR | 20190122289 A | 10/2019 |
| TW | I1613700 B | 2/2018 |

\* cited by examiner

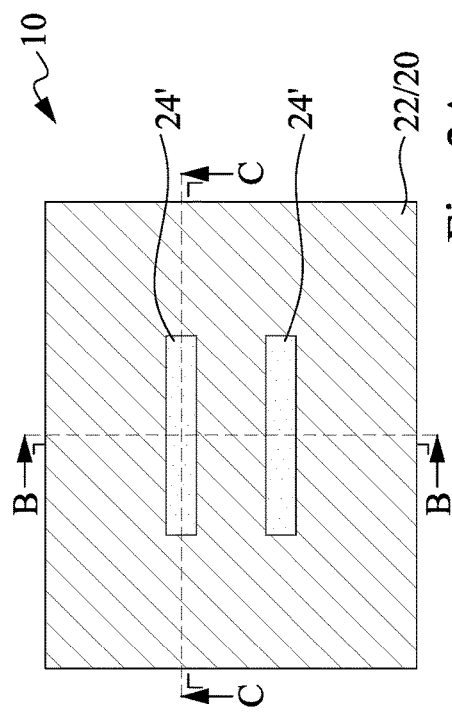
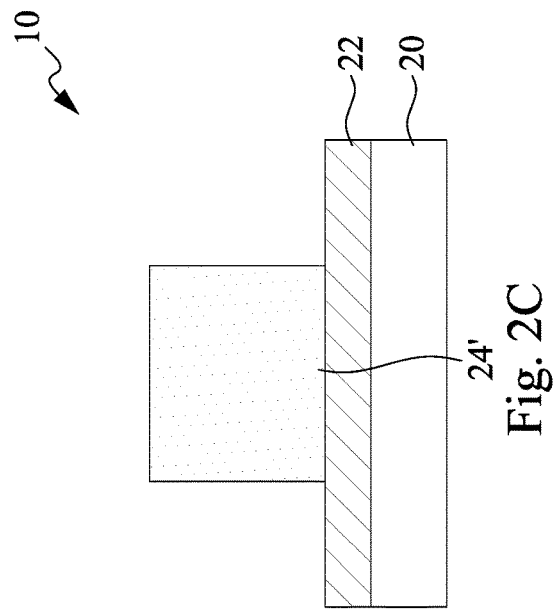
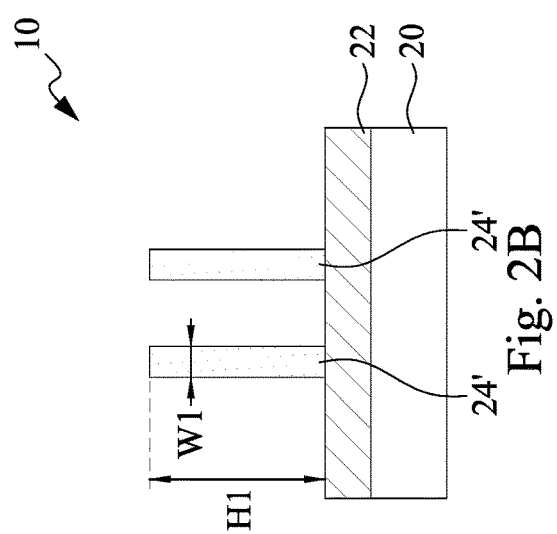

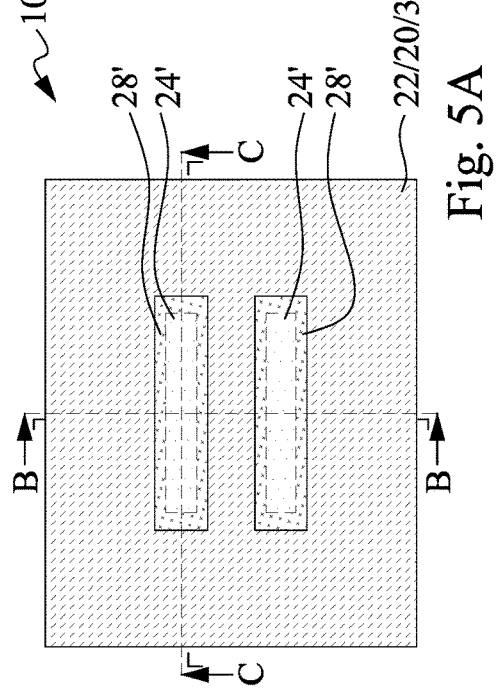
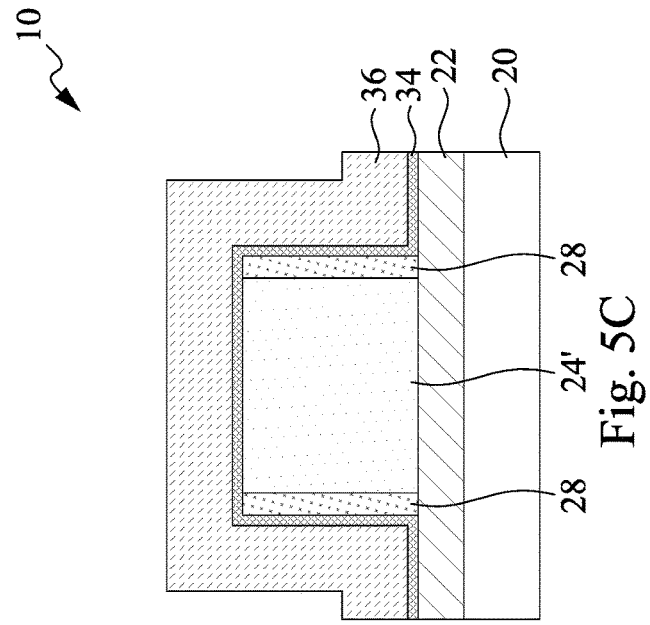
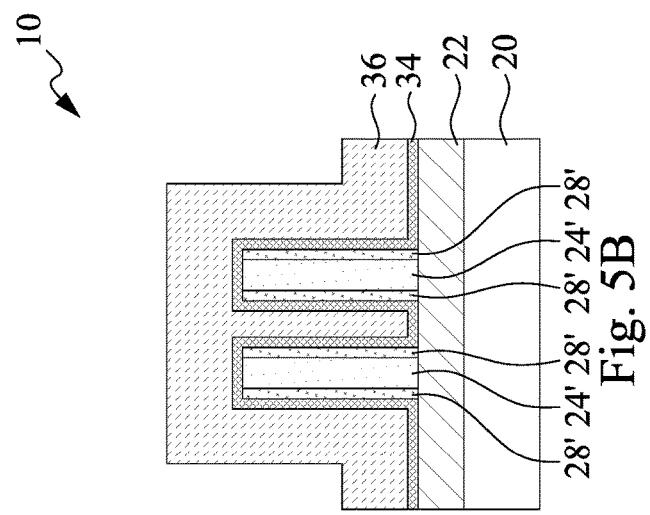

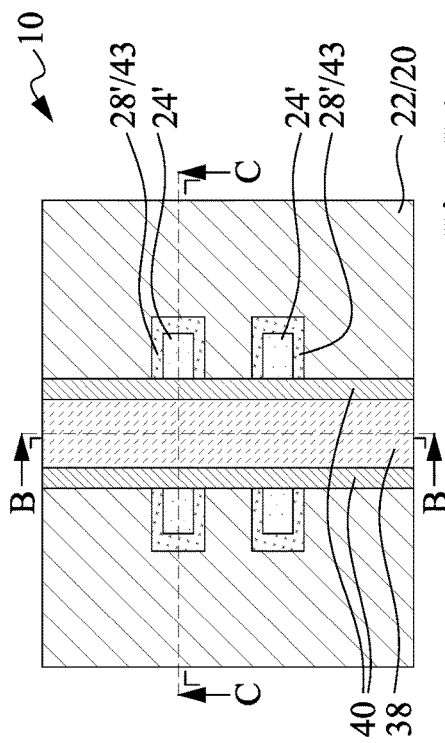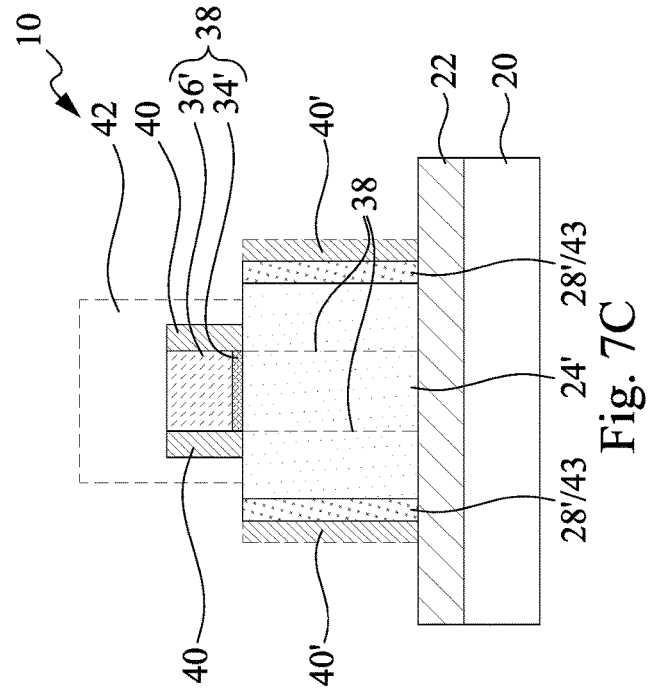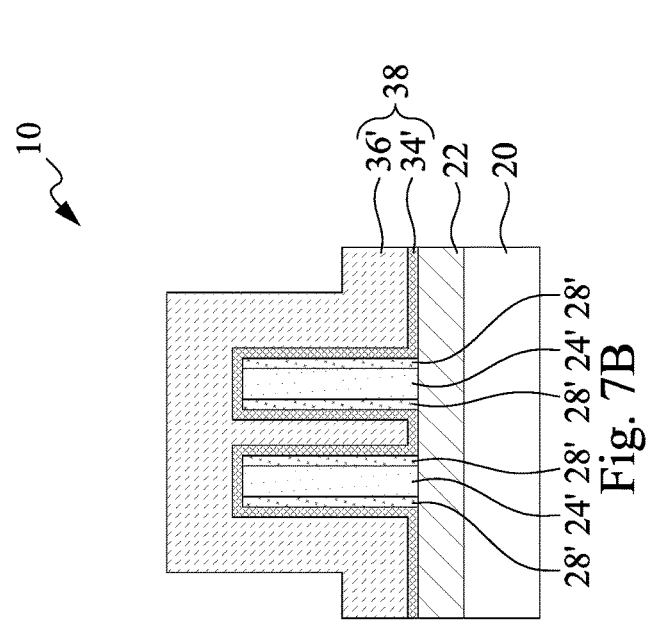

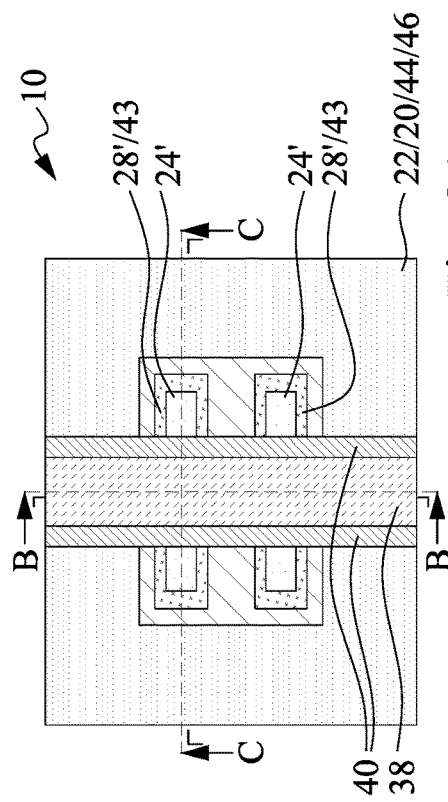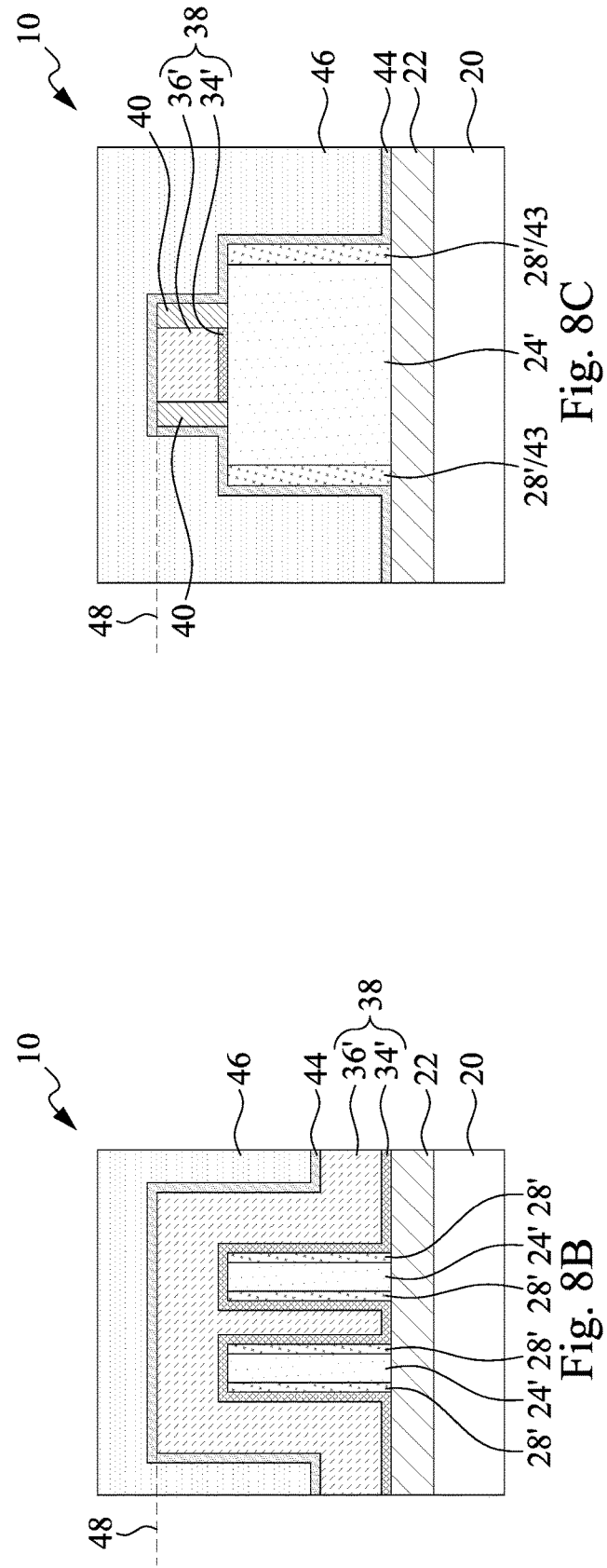

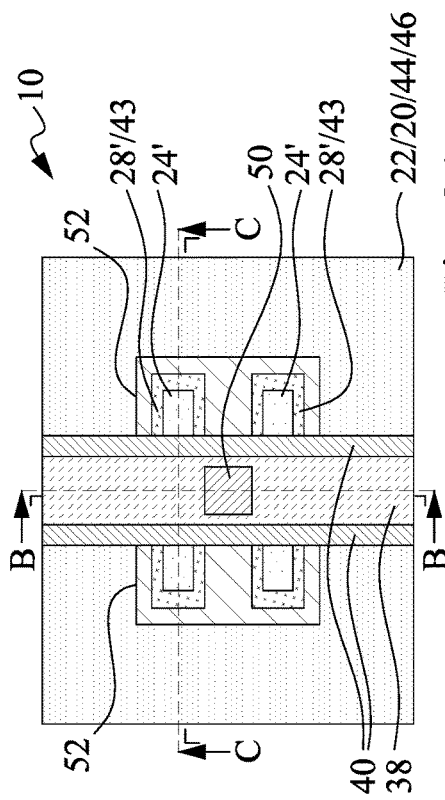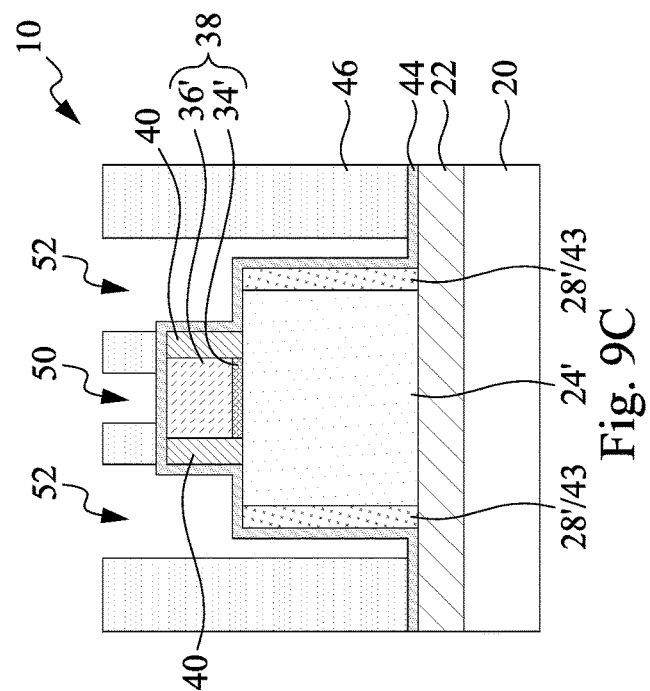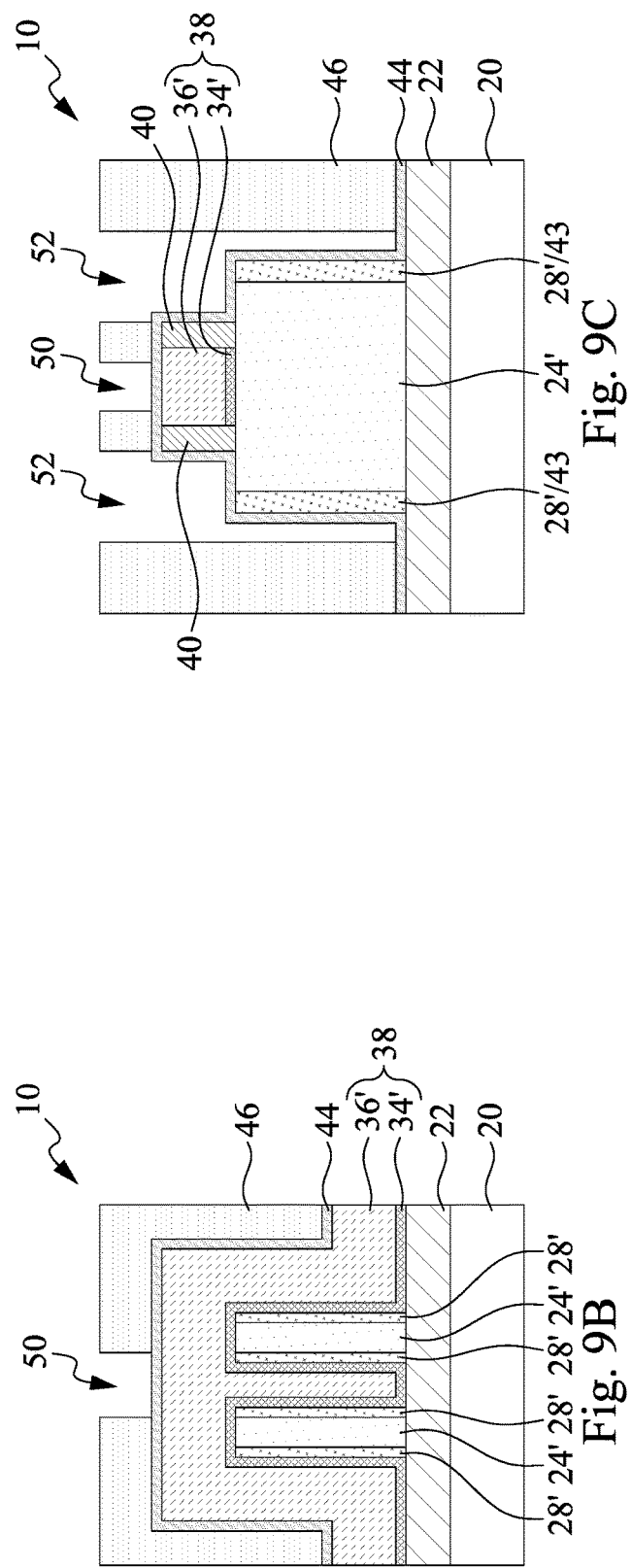

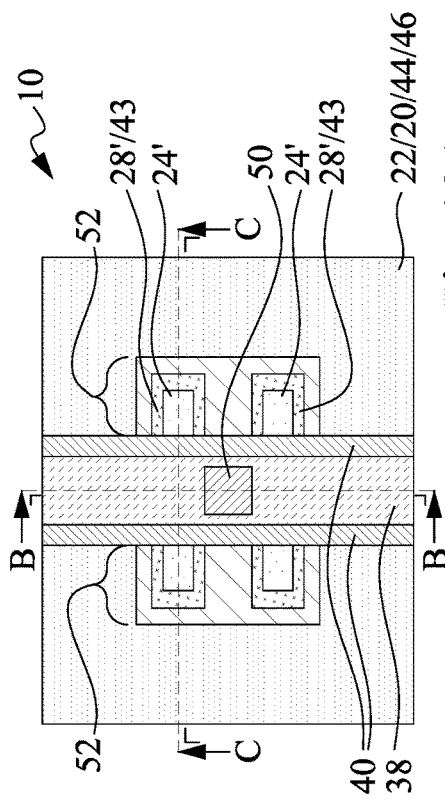
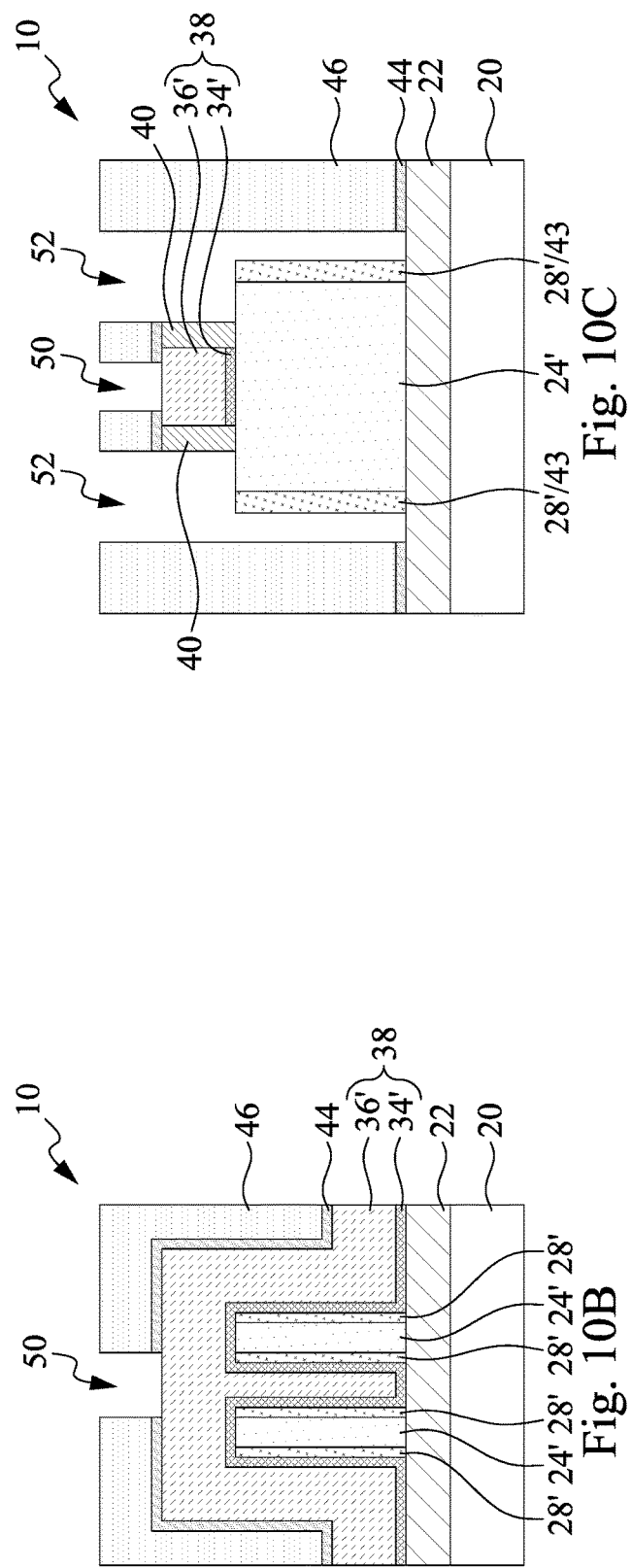

FORMING 3D TRANSISTORS USING 2D VAN DER WAALS MATERIALS

PRIORITY CLAIM AND CROSS-REFERENCE

This application claims the benefit of the U.S. Provisional Application No. 62/947,864, filed on Dec. 13, 2019, and entitled "Semiconductor Device and Method," which application is hereby incorporated herein by reference.

BACKGROUND

Semiconductor devices are used in a variety of electronic applications such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 1B, 1C, 2A, 2B, 2C, 3A, 3B, 3C, 4A, 4B, 4C, 5A, 5B, 5C, 6A, 6B, 6C, 7A, 7B, 7C, 8A, 8B, 8C, 9A, 9B, 9C, 10A, 10B, 10C, 11A, 11B, 11C, and 11D illustrate the plan views and cross-sectional views of intermediate stages in the formation of a three-dimensional transistor including a two-dimensional material in accordance with some embodiments.

DETAILED DESCRIPTION

Figure 1A:
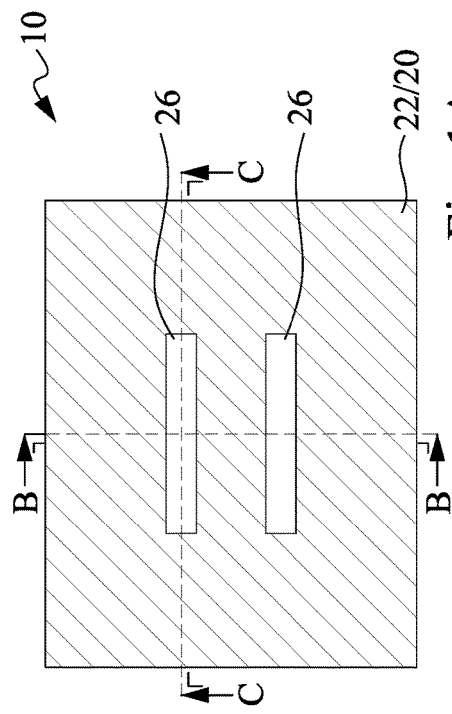

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include the embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A three-dimensional (3D) transistor formed of a two-dimensional (2D) semiconductor material and the method of forming the same are provided in accordance with some embodiments. In accordance with some embodiments of the present disclosure, the 3D transistor includes a dielectric fin, with the 2D semiconductor material formed on the sidewalls of the dielectric fin. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1A, 1B, 1C, 2A, 2B, 2C, 3A, 3B, 3C, 4A, 4B, 4C, 5A, 5B, 5C, 6A, 6B, 6C, 7A, 7B, 7C, 8A, 8B, 8C, 9A, 9B, 9C, 10A, 10B, 10C, 11A, 11B, 11C, and 11D illustrate the plan views and cross-sectional views of intermediate stages in the formation of a three-dimensional transistor using a two-dimensional material in accordance with some embodiments. The corresponding processes are also reflected schematically in the process flow shown in FIG. 15. Throughout the present disclosure, a figure number may be followed by a letter "A," "B," or "C," wherein the letter "A" indicates that the respective view is a plan view (a top view), the letter "B" indicates that the respective figure is obtained from the reference cross-section B-B in the respective plan view, and letter "C" indicates that the respective figure is obtained from the reference cross-section C-C in the respective plan view. For example, FIG. 1B illustrates the reference cross-section B-B in FIG. 1A, and FIG. 1C illustrates the reference cross-section C-C in FIG. 1A.

Figure 1C:
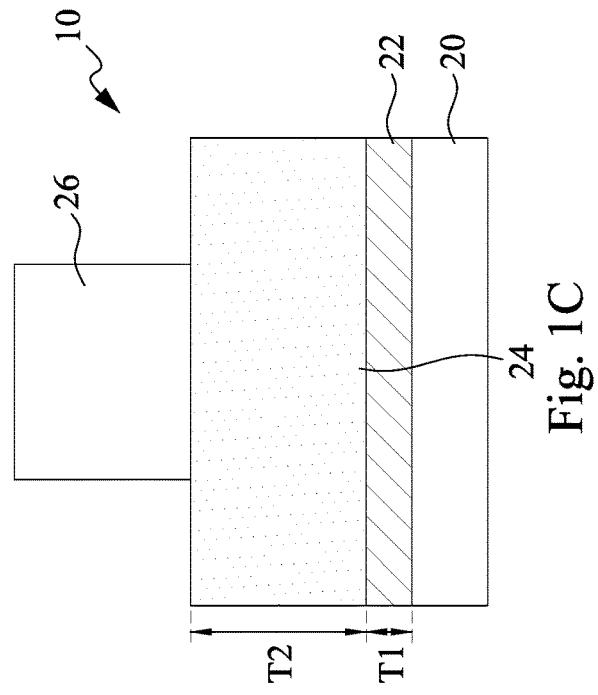
Figure 1B:
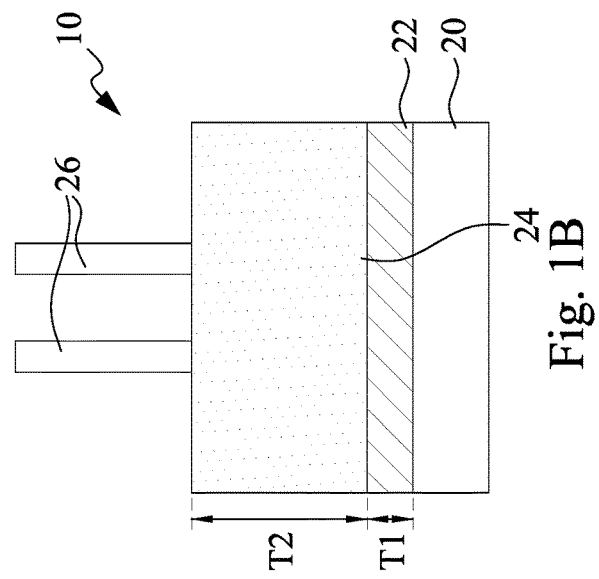

Referring to FIGS. 1A, 1B, and 1C, wafer 10, which includes substrate 20, is provided. In accordance with some embodiments of the present disclosure, the substrate 20 may be a semiconductor substrate, such as a bulk semiconductor substrate, a Semiconductor-On-Insulator (SOI) substrate, or the like. Substrate 20 may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including carbon-doped silicon, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 15:
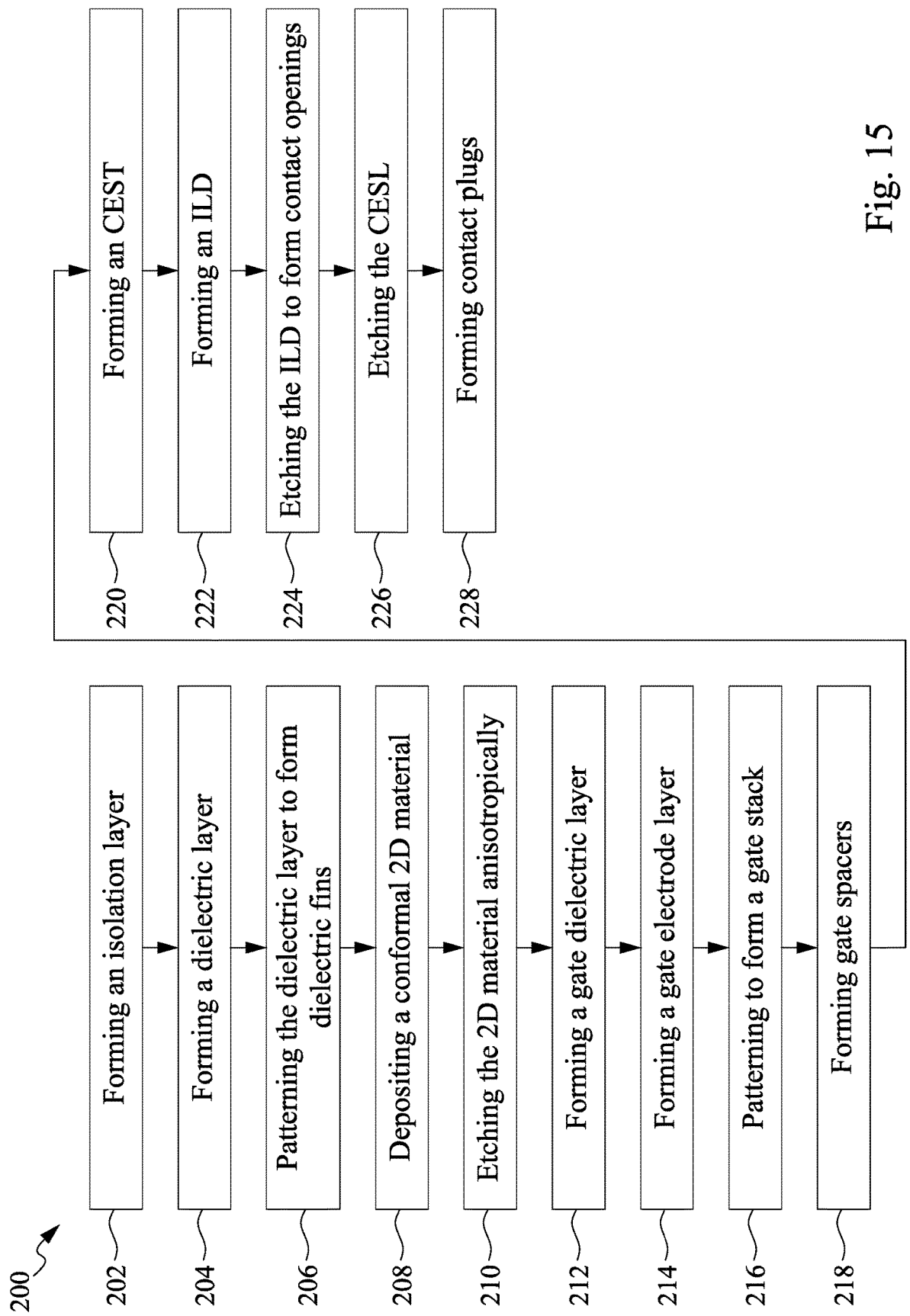
FIG. 15 illustrates a process flow for forming a three-dimensional transistor including a two-dimensional material in accordance with some embodiments.

Isolation layer 22 is formed over substrate 20. The respective process is illustrated as process 202 in the process flow 200 as shown in FIG. 15. In accordance with some embodiments of the present disclosure, isolation layer 22 is in physical contact with substrate 20. In accordance with alternative embodiments of the present disclosure, between isolation layer 22 and substrate 20, there may be other layers and devices including, and not limited to, dielectric layers, metal features, or the like. For example, there may be inter-layer dielectrics, inter-metal dielectrics (which may include low-k dielectric layers), and/or the like. There may be, or may not be, integrated circuit devices such as passive devices (capacitors, resistors, inductors, or the like) and/or active devices (transistors, diodes, or the like) formed between isolation layer 22 and substrate 20.

In accordance with some embodiments of the present disclosure, isolation layer 22 is formed of or comprises a nitride such as silicon nitride, an oxide such as silicon oxide, silicon oxy-fluoride (SiOF), silicon oxy-carbide (SiOC), or the like, or a high-k dielectric material such as aluminum oxide, hafnium oxide, zirconium oxide, lanthanum oxide, or the like. Isolation layer 22 may be a crystalline layer (single crystalline or polycrystalline) or an amorphous layer. Isolation layer 22 may have a single-layer structure or a composite structure including a plurality of layers. For example, isolation layer 22 may include a bi-layer structure, a tri-layer structure, or the like. The bi-layer structure may include two layers formed of different materials, for example, a silicon oxide layer and a silicon nitride layer over the silicon oxide layer. In accordance with some embodiments of the present disclosure, the thickness T1 (FIGS. 1B and 1C) of isolation layer 22 is in the range between about 5 nm and about 20 nm.

The formation process of isolation layer 22 may include one or a plurality of deposition process(es) including, for example, a Plasma Enhanced Chemical Vapor Deposition (PECVD) process, a Plasma Enhanced Atomic Layer Deposition (PEALD) process, an Atomic Layer Deposition (ALD) process, a Chemical Vapor Deposition (CVD) process, or the like. In accordance with some embodiments of the present disclosure, isolation layer 22 may also be formed through thermal oxidation, chemical oxidation, or the like, for example, when isolation layer 22 comprises silicon oxide and when substrate 20 is formed of or comprises silicon.

Dielectric layer 24 is formed over isolation layer 22. The respective process is illustrated as process 204 in the process flow 200 as shown in FIG. 15. Dielectric layer 24 is formed of a material different from the material of isolation layer 22. In accordance with some embodiments of the present disclosure, dielectric layer 24 is formed of or comprises an oxide such as silicon oxide, silicon oxy-fluoride (SiOF), silicon oxy-carbide (SiOC), or the like. Dielectric layer 24 may be formed of a non-high-k material, and may also be formed of a low-k dielectric layer, which has a k value lower than 3.8. The k value may also be lower than about 3.5, or lower than about 3.0. Using low-k dielectric layer has the advantageous feature of reducing the coupling of drain region to the channel region in the resulting transistor, as will be discussed in subsequent paragraphs. Dielectric layer 24 may be porous including small pores to have reduced k value. In accordance with some embodiments of the present disclosure, dielectric layer 24 is formed using CVD, ALD, PEALD, PECVD, or the like. In accordance with some embodiments of the present disclosure, the thickness T2 (FIG. 1C) of dielectric layer 24 is in the range between about 20 nm and about 60 nm.

A patterned etching mask 26, which may be a patterned photo resist, is formed over dielectric layer 24. As shown in FIG. 1A, the patterned etching mask 26 may include a plurality of elongated strips. It is appreciated that although two elongated strips are illustrate, based on which a transistor is to be formed, in accordance with other embodiments, there may be a single strip, three strips, four strips, or more for forming a transistor.

The patterned etching mask 26 is then used to etch dielectric layer 24. The respective process is illustrated as process 206 in the process flow 200 as shown in FIG. 15. Accordingly, dielectric fins 24' are formed, as shown in FIGS. 2A, 2B, and 2C. The etching is performed using an anisotropic etching process. In the etching process, isolation layer 22 is used as an etch stop layer. In accordance with some embodiments of the present disclosure, the width W1 (FIG. 2B) of dielectric fins 24' is in the range between about 3 nm and about 10 nm. The height H1 of dielectric fins 24' may be in the range between about 20 nm and about 60 nm.

Figure 3A:
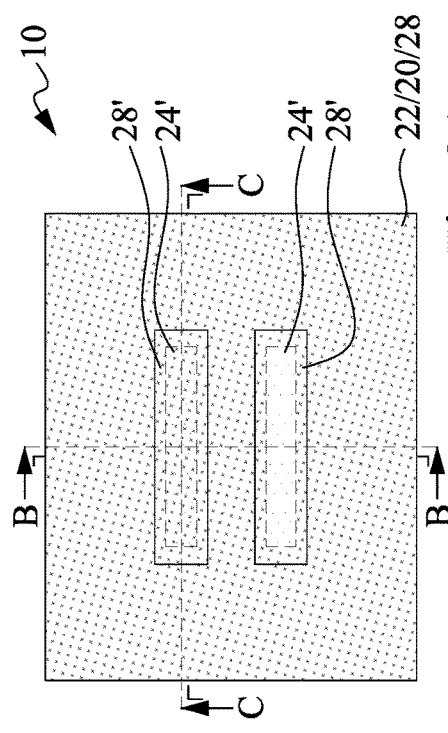
Figure 3C:
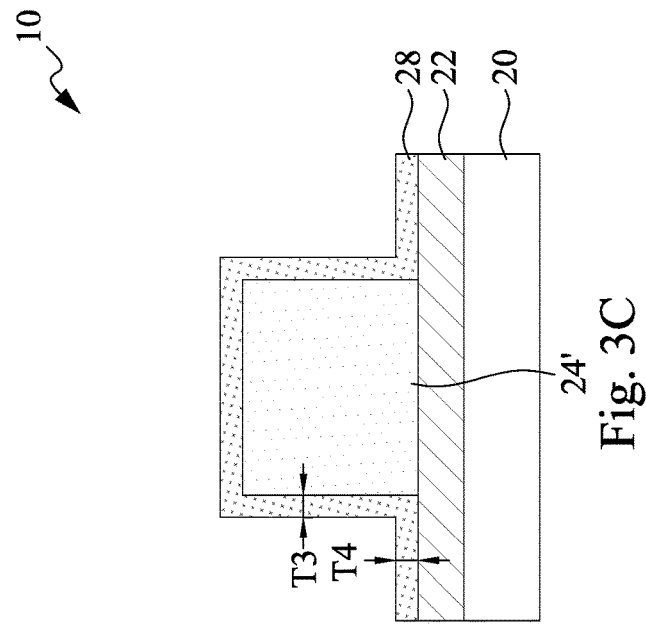
Figure 3B:
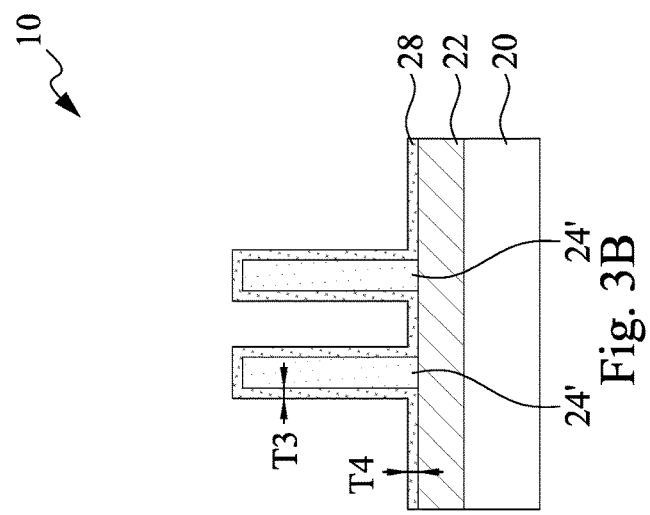

Referring to FIGS. 3A, 3B, and 3C, semiconductor layer 28 is formed through deposition. The respective process is illustrated as process 208 in the process flow 200 as shown in FIG. 15. In accordance with some embodiments of the present disclosure, semiconductor layer 28 is formed of a 2D material, which is also referred to as a Van Der Waals material. The 2D material includes one or a plurality of monolayers. Strong bonds such as covalence bonds are formed within the monolayers to bond the atoms in the same monolayer to each other. The bonding force between neighboring monolayers is Van Der Waals force, which is a weak force. Accordingly, although semiconductor layer 28 may include more than one monolayer, semiconductor layer 28 is thus referred to as a Van Der Waals material. The thicknesses T3 and T4 of semiconductor layer 28 may be smaller than about 5 nm, and may be in the range between about 0.5 nm and about 5 nm, or in the range between about 0.7 nm and about 3 nm.

In accordance with some embodiments of the present disclosure, semiconductor layer 28 is formed of or comprises a Transition Metal Dichalcogenide (TMD) material, which comprises the compound of a transition metal and a group-VIA element. The transition metal may include W, Mo, Ti, V, Co, Ni, Zr, Tc, Rh, Pd, Hf, Ta, Re, Ir, Pt, or the like. The group-VIA element may be sulfur (S), selenium (Se), tellurium (Te), or the like. For example, semiconductor layer 28 may be formed of or comprise $MoS_2$, $MoSe_2$, $WS_2$, $WSe_2$, or the like.

Figure 13:
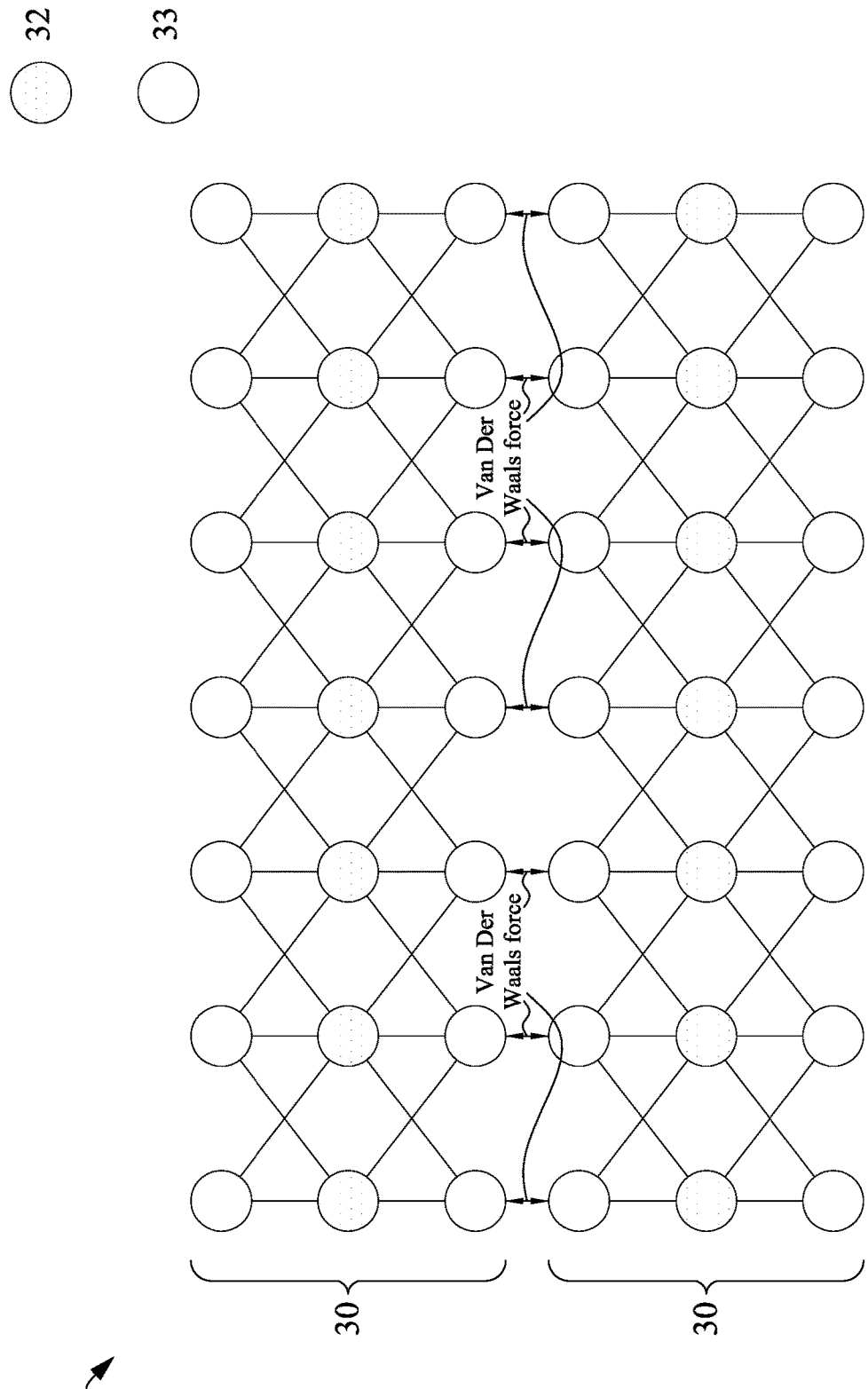
FIG. 13 illustrates the monolayers of a two-dimensional material in accordance with some embodiments.

FIG. 13 illustrates a portion of an example semiconductor layer 28, with two monolayers 30 illustrated as an example, although the total number of mono layers may be greater or smaller. In accordance with some embodiments of the present disclosure, the transition metal atoms 32 form a layer in the middle, and the group-VIA atoms 33 form a first layer underlying the layer of transition metal atoms 32, and a second layer over the layer of transition metal atoms 32. The transition metal atoms 32 may be W atoms, Mo atoms, Ti atoms, or the like as aforementioned, and the group-VIA atoms 33 may be S atoms, Se atoms, Te atoms, or the like as aforementioned. Each of the transition metal atoms 32 is bonded to four group-VIA atoms 33, and each of the group-VIA atoms 33 is bonded to two transition metal atoms 32. The combination of one layer of transition metal atoms 32 and two layers of the group-VIA atoms 33 is referred to as a monolayer 30 of the TMD material. The bonds between transition metal atoms 32 and group-VIA atoms 33 are covalence bonds, and the bonds between monolayers 30 are through Van Der Waals force.

Referring back to FIGS. 3A, 3B, and 3C, in accordance with some embodiments of the present disclosure, semiconductor layer 28 is a conformal layer, with the thickness T3 (FIGS. 3B and 3C) of vertical portions and thickness T4 of the horizontal portions close to each other, for example, with a difference smaller than about 20 percent (or 10 percent or smaller) of either of thicknesses T3 and T4. In accordance with some embodiments of the present disclosure, semiconductor layer 28 is deposited using CVD, with $MoO_3$ powder and sulfur (s) (or Se) powder as precursors, and nitrogen ($N_2$) as a carrier gas. The flow rate of each of the $MoO_3$ powder and Se powder may be in the range between about 5 sccm and about 100 sccm. In accordance with alternative embodiments of the present disclosure, PECVD or another applicable method is used. The deposition temperature may be between about 750° C. and about 1,000° C. in accordance with some embodiments of the present disclosure, and higher or lower temperatures may be used. The deposition duration may be in the range between about 10 minutes and about 1 hour. The process conditions are controlled to achieve the desirable total count of monolayers. In accordance with some embodiments of the present disclosure, semiconductor layer 28 includes between 1 (a single monolayer) and about 4 monolayers, while more monolayers maybe formed. Correspondingly, the thicknesses T3 and T4 may be in the range between about 0.7 nm (corresponding to a single monolayer) and about 3 nm (corresponding to four monolayers).

Semiconductor layer 28 may be doped with a well-doping in accordance with some embodiments. For example, when the resulting transistor 62 is a p-type transistor, semiconductor layer 28 is doped as n-type by doping, for example, potassium (K). When the resulting transistor 62 is an n-type transistor, semiconductor layer 28 is doped as p-type by doping, for example, using $NO_2$.

Figure 4A:
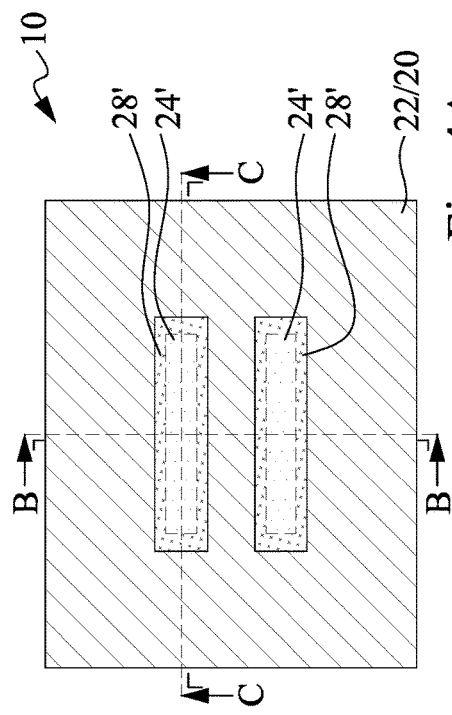
Figure 4C:
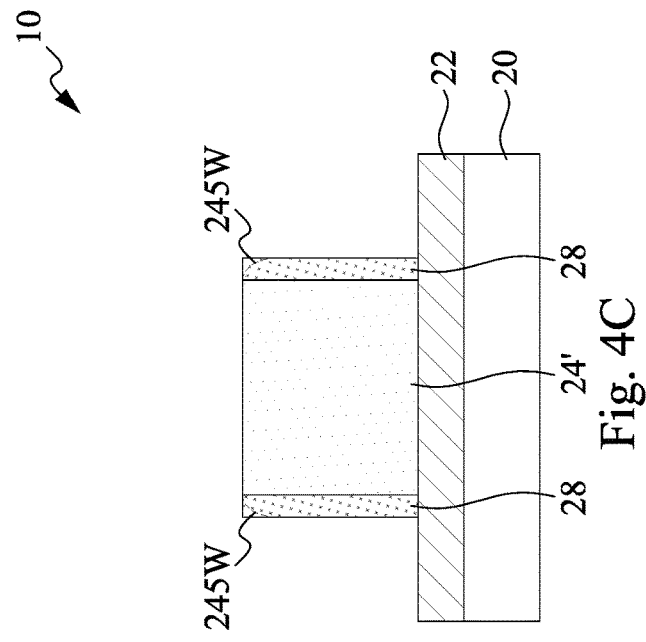
Figure 4B:
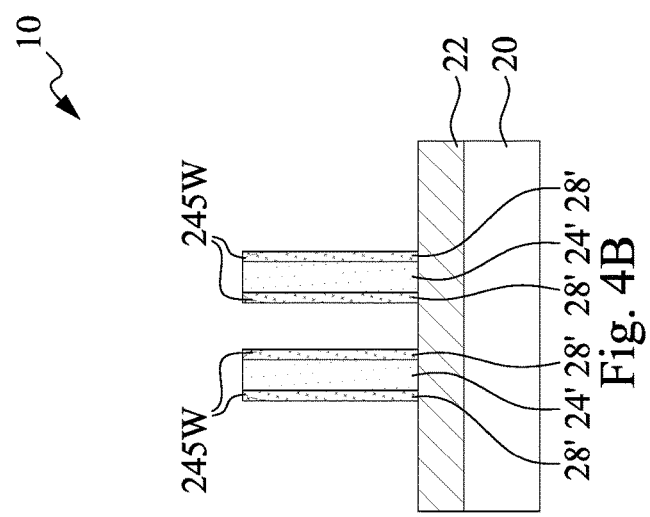

FIGS. 4A, 4B, and 4C illustrate the plan view and the cross-sectional views of the formation of vertical semiconductor ring 28', which is formed by performing an anisotropic etching process on semiconductor layer 28. The respective process is illustrated as process 210 in the process flow 200 as shown in FIG. 15. In accordance with some embodiments of the present disclosure, the etching is performed using an etching gas comprising Ar, $SF_6$, or the like, with the plasma being generated in the etching. As a result of the anisotropic etching process, the horizontal portions of semiconductor layer 28 as shown in FIGS. 3B and 3C are removed, while the vertical portions of semiconductor layer 28 on the sidewalls of dielectric fins 24' remain after the etching process. Due to the anisotropic etching, the top edges of the vertical semiconductor ring 28' may have slanted top surfaces (edges) 24SW. In subsequent figures, the slanted top edges are not shown, while they may still exist in the final transistor 62 as shown in FIGS. 11A, 11B, 11C, and 11D. The topmost tip of vertical semiconductor ring 28' may be at the same height as, or lower than, the top surfaces of dielectric fins 24'. In the top view as shown in FIG. 4A, vertical semiconductor ring 28' have the shape of full rings encircling the respective dielectric fins 24'.

The subsequent figures illustrate the formation of additional features of the transistor in accordance with some embodiment. The illustrated process is a gate-first process, in which the gate stack of the transistor is formed before the formation of source/drain regions of the transistor. In accordance with alternative embodiments of the present disclosure, a gate-last process may be adopted, in which a dummy gate stack is formed, and is subsequently replaced with a replacement gate stack.

Referring to FIGS. 5A, 5B, and 5C, gate dielectric layer 34 is deposited. The respective process is illustrated as process 212 in the process flow 200 as shown in FIG. 15. In accordance with some embodiments of the present disclosure, the deposited gate dielectric layer 34 and gate electrode layer 36 are used for forming a dummy gate stack. For example, gate dielectric layer 34 may be formed of silicon oxide. In accordance with other embodiments, gate dielectric layer 34 is not formed when it is a dummy gate dielectric. Gate electrode layer 36 may be formed, for example, using polysilicon, and other materials may also be used.

In accordance with some embodiments of the present disclosure, the deposited gate dielectric layer 34 and gate electrode layer 36 are used for forming the actual gate stack, which exists in the final transistor 62 (FIGS. 11A, 11B, 11C, and 11D). Accordingly, gate dielectric layer 34 may include silicon oxide, a high-k dielectric material such as $HfO_2$, $ZrO_2$, HfZrOx, HfSiOx, HfSiON, ZrSiOx, HfZrSiOx, $Al_2O_3$, HfAlOx, HfAlN, ZrAlOx, $La_2O_3$, $TiO_2$, $Yb_2O_3$, silicon nitride, or the like, or composite layers thereof. For example, gate dielectric layer 34 may include a silicon oxide layer and a high-k dielectric layer over the silicon oxide layer.

Gate electrode layer 36 is formed over gate dielectric layer 34. The respective process is illustrated as process 214 in the process flow 200 as shown in FIG. 15. Gate electrode layer 36 may include one or a plurality of layers. In accordance with some embodiments of the present disclosure, gate electrode layer 36 may have a diffusion barrier layer, a work function layer over the diffusion barrier layer, a capping layer over the work function layer, and may or may not include a filling-metal region over the capping layer. The diffusion barrier layer may be formed of or comprise TiN, TiSiN, or the like. The work-function layer may be formed of or comprise materials that are selected according to whether the respective transistor is an n-type transistor or a p-type transistor. A metal layer formed of a metal or metal alloy such as tungsten, cobalt, or the like may be formed to form the filling-metal region. In accordance with other embodiments, gate electrode layer 36 comprises polysilicon.

Figure 6A:
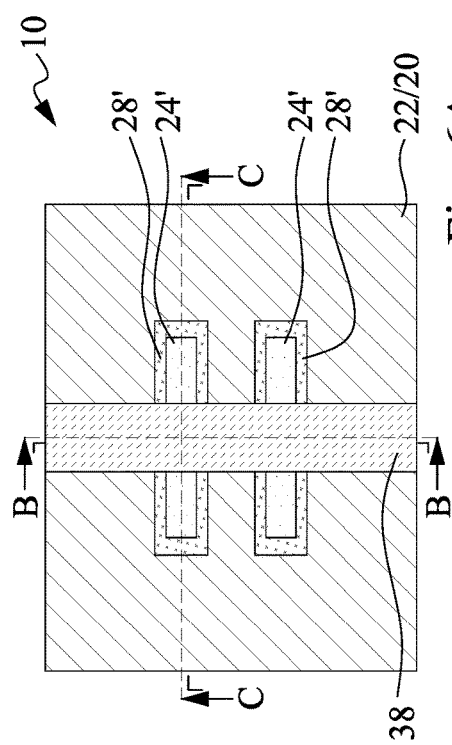
Figure 6C:
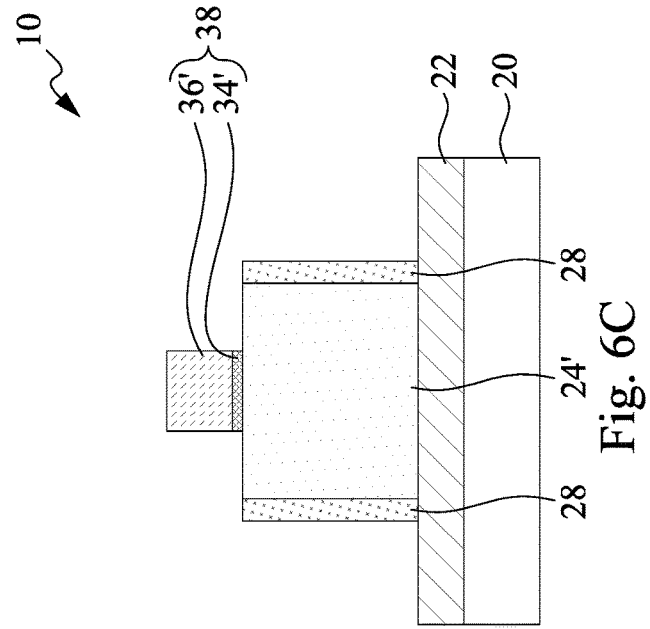
Figure 6B:
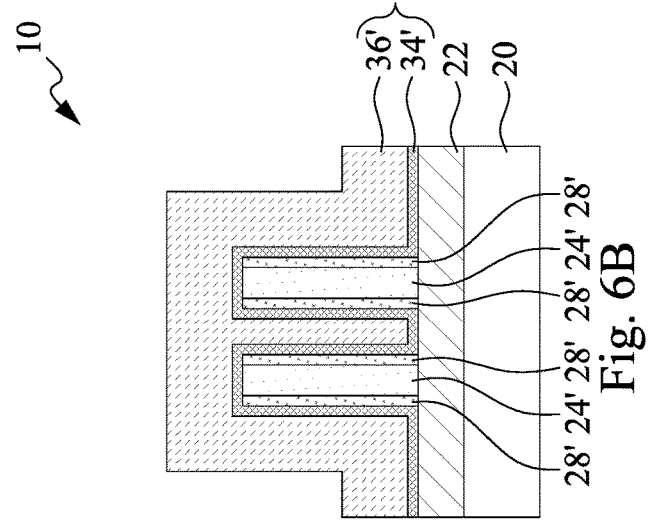

Gate dielectric layer 34 and gate electrode layer 36 are then patterned in a patterning process(es), resulting in the gate stack 38 as shown in FIGS. 6A, 6B, and 6C. The respective process is illustrated as process 216 in the process flow 200 as shown in FIG. 15. The remaining portion of the patterned gate dielectric layer 34 is referred to as gate dielectric 34', and the remaining portion of the patterned gate electrode layer 36 is referred to as gate electrode 36'. Gate dielectric 34' and gate electrode 36' are collectively referred to as gate stack 38. As shown in FIG. 6A, gate stack 38 covers a portion of each of the vertical semiconductor rings 28', and leaving the opposing end portions of the vertical semiconductor rings 28' exposed in an example. It is appreciated that although one gate stack 38 is illustrated, a plurality of gate stacks 38 may be formed on dielectric fins 24' and vertical semiconductor rings 28', with the plurality of gate stacks 38 being parallel to each other. The plurality of gate stacks 38 are spaced apart from each other, each formed on one portion of each of the vertical semiconductor rings 28' and dielectric fins 24', and leaving other portions of the vertical semiconductor rings 28' and dielectric fins 24' exposed.

FIGS. 7A, 7B, and 7C illustrate the formation of gate spacers 40 on the sidewalls of gate stack 38. The respective process is illustrated as process 218 in the process flow 200 as shown in FIG. 15. In accordance with some embodiments of the present disclosure, gate spacers 40 are formed of a dielectric material(s) such as silicon nitride, silicon oxide, silicon carbo-nitride, or the like, and may have a single-layer structure or a multi-layer structure including a plurality of dielectric layers. The formation of the gate spacers 40 may include depositing a blanket spacer layer(s), and performing an anisotropic etching process(es) to remove the horizontal portions of the spacer layer. Since there may be some portions (schematically shown as 40') of the spacer layer left on the sidewalls of the vertical semiconductor rings 28', an additional etching process may be performed to remove the undesirable portions 40'. The removal of spacer portions 40' may include forming an etching mask 42 (such as a patterned photo resist) to cover gate spacers 40 and gate stack 38, and performing an isotropic etching process to remove the undesirable spacers 40' on the sidewalls of the vertical semiconductor rings 28'. As a result of etching the undesirable spacers 40', the entire sidewall surfaces (including the bottom portions close to isolation layer 22) of vertical semiconductor rings 28' are exposed. This will advantageously increase the contact area between the subsequently formed source/drain contact plug and vertical semiconductor rings 28'. Etching mask 42, if formed, is then removed.

In accordance with some embodiments of the present disclosure, the exposed portions of vertical semiconductor rings 28' are doped to form source/drain regions 43. When the resulting transistor is an n-type transistor, the exposed portions of vertical semiconductor rings 28' are doped as n-type by doping, for example, potassium. When the resulting transistor is a p-type transistor, the exposed portions of vertical semiconductor rings 28' are doped as p-type by doping, for example, $NO_2$.

FIGS. 8A, 8B, and 8C illustrate the structure after the formation of Contact Etch Stop Layer (CESL) 44. The respective process is illustrated as process 220 in the process flow 200 as shown in FIG. 15. CESL 44 may be formed of silicon oxide, silicon nitride, silicon carbo-nitride, or the like, and may be formed using CVD, ALD, or the like. As shown in FIG. 8C, CESL 44 is formed as a conformal layer, and may be in physical contact with the sidewalls of vertical semiconductor rings 28'. Furthermore, CESL 44 may be in physical contact with the top surface of dielectric fin 24'.

FIGS. 8A, 8B, and 8C further illustrate the formation of Inter-Layer Dielectric (ILD) 46. The respective process is illustrated as process 222 in the process flow 200 as shown in FIG. 15. ILD 46 may include a dielectric material formed using, for example, FCVD, spin-on coating, CVD, or another deposition method. ILD 46 may be formed of an oxygen-containing dielectric material, which may be a silicon-oxide based material such as silicon oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 46. In accordance with some embodiments of the present disclosure, as shown in FIGS. 8B and 8C, the planarization process stops before CESL 44 is exposed, and a layer of ILD 46 remains over CESL 44. In accordance with alternative embodiments of the present disclosure, the planarization may be performed until gate stack 38 and gate spacers 40 are revealed, and a dashed line 48 is drawn to show an example position where the planarization process is stopped.

Figure 12:
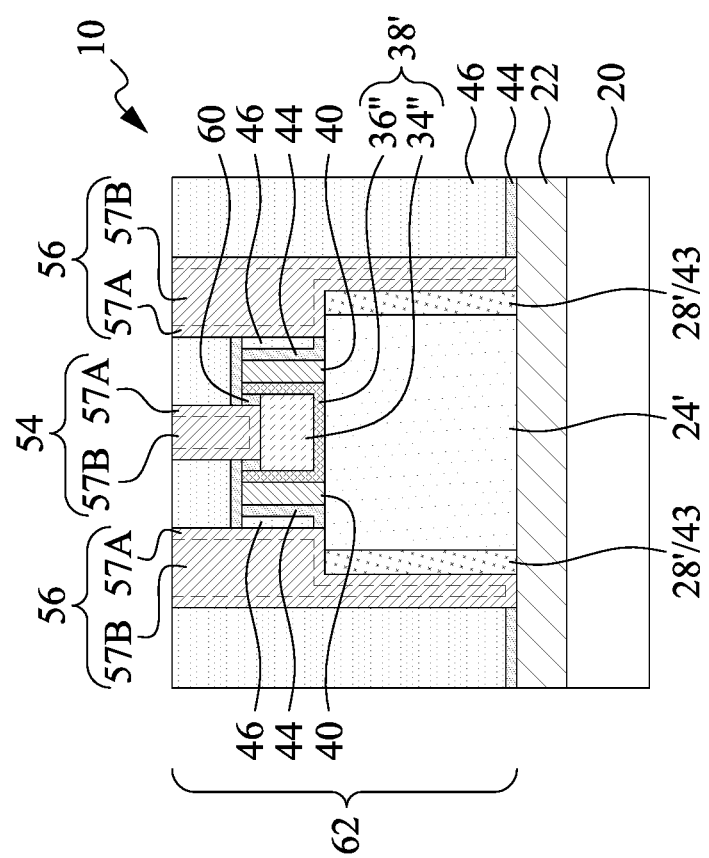
FIG. 12 illustrates a cross-sectional view of a portion of a three-dimensional transistor in accordance with some embodiments.

In accordance with some embodiments in which gate stack 38 is a dummy gate stack, the planarization process may be stopped at position 48, and dummy gate stack 38 is replaced with a replacement gates stack 38', which is shown in FIG. 12 as an example. The replacement process may include performing an etching process(es) to remove dummy gate stack 38, with a trench formed between opposing gate spacers 40, depositing a dielectric layer and an gate electrode layer (which may include a plurality of layers) extending into the trench, and performing a planarization process to remove excess materials. The materials of the resulting replacement gate dielectric 34" and gate electrode 36" (FIG. 12) may be found in the discussion of the gate dielectric layer 34 and gate electrode layer 36, and are not repeated herein.

FIGS. 9A, 9B, and 9C illustrate the formation of gate contact opening 50 and source/drain contact openings 52. The respective process is illustrated as process 224 in the process flow 200 as shown in FIG. 15. The formation process includes an anisotropic etching process. The etching is performed using CESL 44 as an etch stop layer. Accordingly, the portions of CESL 44 on the sidewalls of vertical semiconductor rings 28', and the horizontal portions of CESL 44 on top of dielectric fin 24', are exposed to source/drain contact openings 52.

Referring to FIGS. 10A, 10B, and 10C, the exposed portions of CESL 44 are removed to extend the gate contact opening 50 and source/drain contact openings 52 downwardly. The respective process is illustrated as process 226 in the process flow 200 as shown in FIG. 15. In accordance with some embodiments of the present disclosure, the etching is performed through an isotropic etching process, which may be a wet etching process or a dry etching process. As a result, the entire sidewall surfaces (including the bottom portions close to isolation layer 22) of vertical semiconductor rings 28' are exposed.

FIGS. 11A, 11B, 11C, and 11D illustrate the plan views and cross-sectional views in the formation of gate contact plug 54 and source/drain contact plugs 56. The respective process is illustrated as process 228 in the process flow 200 as shown in FIG. 15. The formation may include depositing one or a plurality of conductive layers to fill gate contact opening 50 and source/drain contact openings 52, and performing a planarization process to remove the excess materials over ILD 46, leaving gate contact plug 54 and source/drain contact plugs 56. In accordance with some embodiments of the present disclosure, the entireties of gate contact plug 54 and source/drain contact plugs 56 are formed of a homogenous conductive material, which may be a metal or a metal alloy including tungsten, cobalt, aluminum, or the like, or the alloys thereof. In accordance with alternative embodiments of the present disclosure, each of gate contact plug 54 and source/drain contact plugs 56 includes an adhesion layer 57A and a homogenous conductive material 57B over the adhesion layer. The adhesion layer 57A may be formed of or comprise titanium, titanium nitride, tantalum, tantalum nitride, or the like. The homogenous conductive material may also be a metal or a metal alloy including tungsten, cobalt, aluminum, or the like, or the alloys thereof.

Figure 11A:
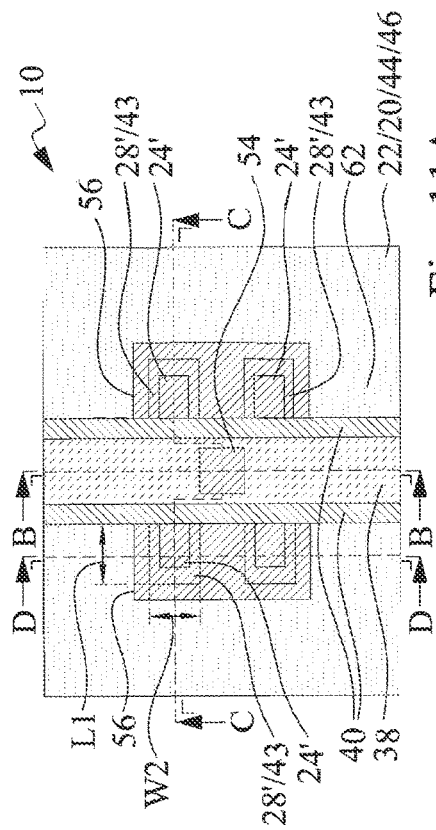
Figure 11C:
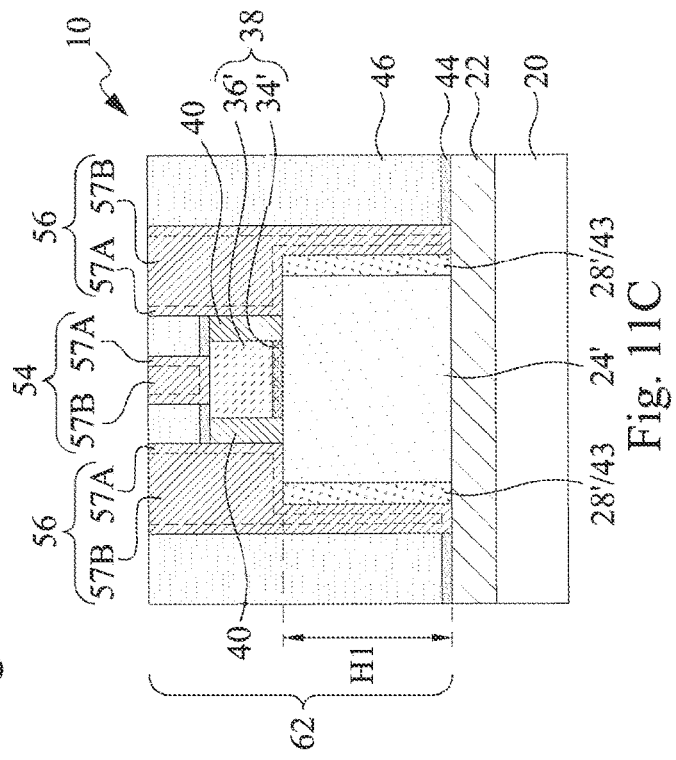
Figure 11B:
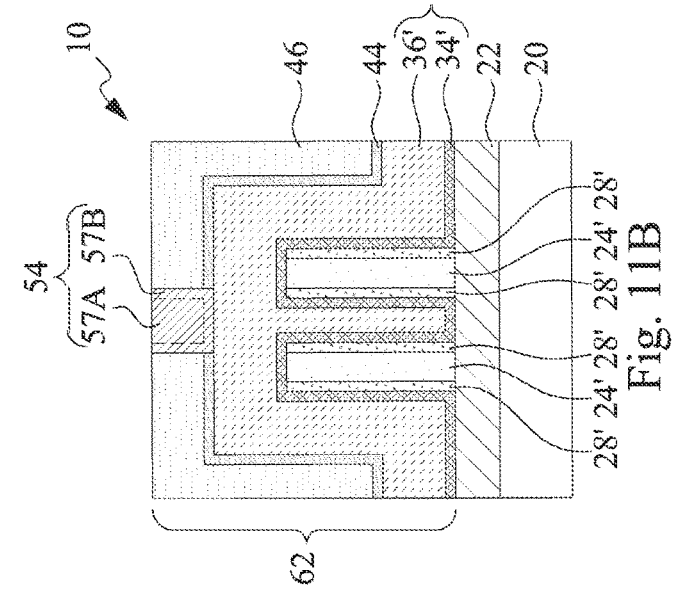
Figure 11D:
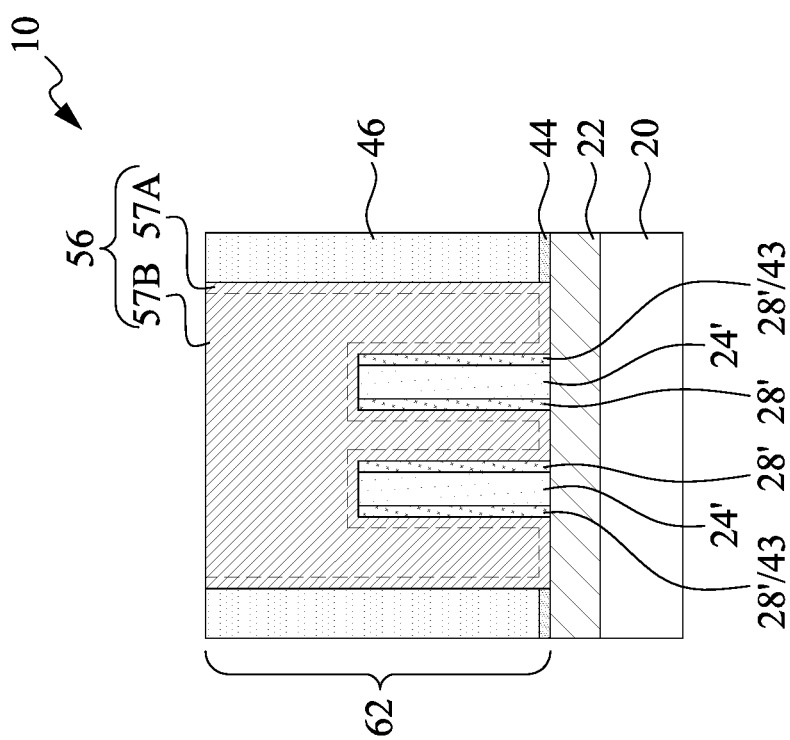

FIG. 11D further illustrates a reference cross-section D-D in FIG. 11A. As shown in FIGS. 11C and 11D, source/drain contact plugs 56 are in contact with the sidewalls of vertical semiconductor rings 28' through edge contact, and the contact area to each of vertical semiconductor rings 28' is equal to H1×(2L1+W2) (FIG. 11A), wherein height H1 is illustrated in FIG. 11C, and length L1 and width W2 are shown in FIG. 11A. Accordingly, the contact area of the contact plugs to the corresponding source/drain regions is large, and the contact resistance is small.

Referring to FIG. 11C, in accordance with some embodiments of the present disclosure, source/drain contact plugs 56 have sidewalls in contact with the sidewalls of the gate spacers 40. Accordingly, the value of L1 (FIG. 11A) is maximized. This may maximize the contact area between source/drain contact plugs 56 to source/drain regions 43, and hence cause the reduction in the source/drain contact resistance. In accordance with alternative embodiments of the present disclosure, the source/drain contact plugs 56 are spaced apart from the respective closest gate spacers 40 to increase process margin. For example, FIG. 12 illustrates the embodiments in which source/drain contact plugs 56 are spaced apart from gate spacers 40.

FIG. 12 illustrates the reference cross-section C-C in FIG. 11A in accordance with alternative embodiments. These embodiments are similar to the embodiments shown in FIG. 11C, except that replacement gate stack 38' is formed, which replaces the gate stack 38 as shown in FIGS. 5A, 5B, and 5C when gate stack 38 is a dummy gate stack. Replacement gate stack 38' includes replacement gate dielectric 34'', and gate electrode 36''. Replacement gate dielectric may include a silicon oxide layer, and may include a high-k dielectric layer over the silicon oxide layer. The high-k dielectric layer may include $HfO_2$, $ZrO_2$, HfZrOx, HfSiOx, HfSiON, ZrSiOx, HfZrSiOx, $Al_2O_3$, HfAlOx, HfAlN, ZrAlOx, $La_2O_3$, $TiO_2$, $Yb_2O_3$, silicon nitride, or the like, or composite layers thereof. The material of the replacement gate electrode 36'' may be formed of or comprise the similar metal-containing materials as discussed referring to gate electrode layer 36 as referring to FIGS. 5B and 5C.

Figure 14:
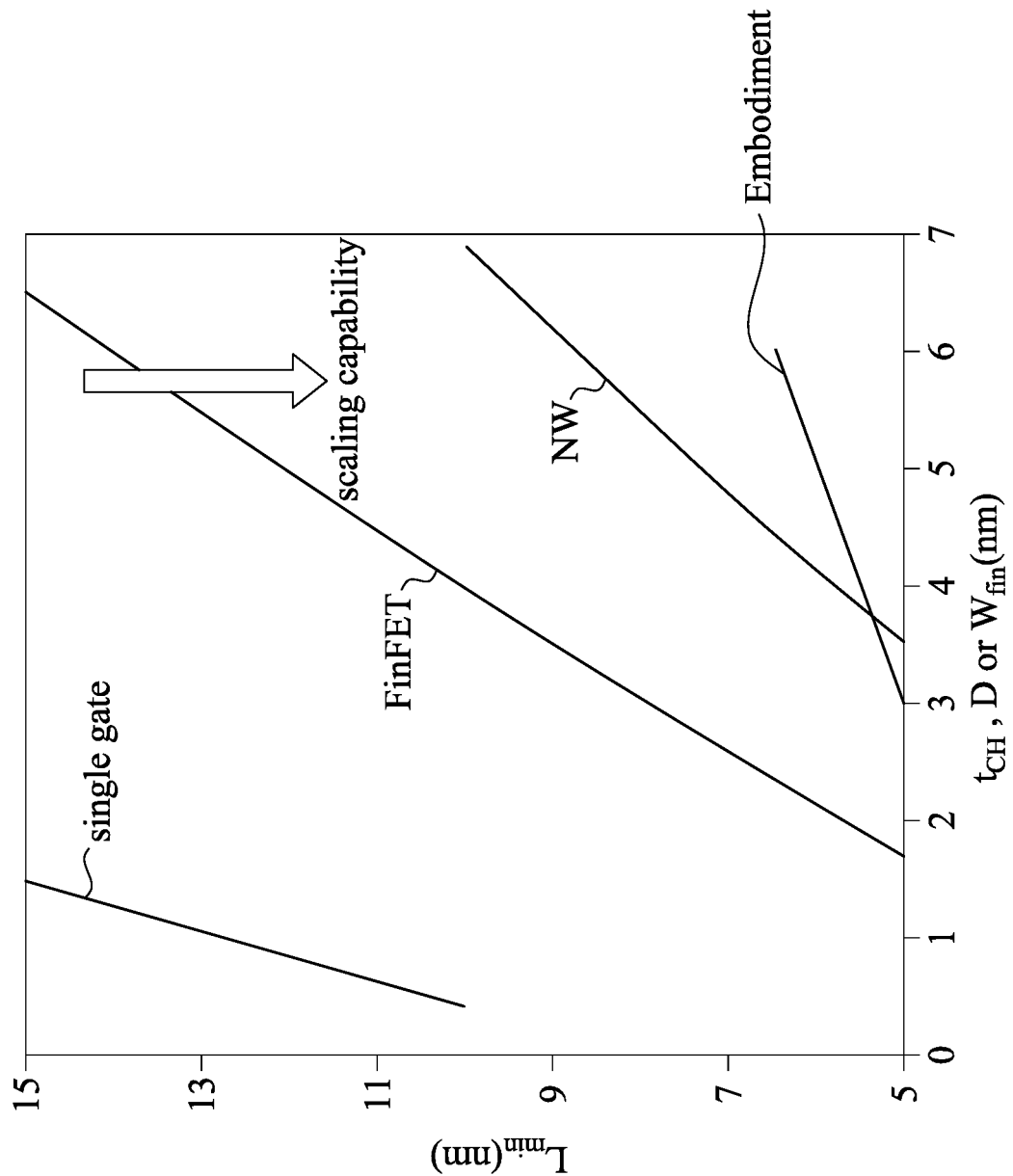
FIG. 14 illustrates the minimum channel lengths vs channel widthwise dimensions of several types of transistors in accordance with some embodiments.

FIG. 14 illustrates the simulation results simulating the performance of several types of transistors. The Y-axis represents the minimum channel length with which the respective transistor can still have good gate-control ability, for example, with subthreshold swing (SS) smaller than about 70 mV/dec. The X-axis represents the dimensions (referred to as channel-width dimensions hereinafter) of the channel in the direction perpendicular to the channel length direction, which dimensions may be channel thickness $t_{CH}$, diameter D of nanowires, and/or the width of the fins $W_{fin}$. The simulated transistors include single gate transistors, FinFETs, nanowire (NW) transistors, and the transistors in accordance with the embodiments of the present disclosure. FIG. 14 illustrates the minimum channel length as a function of the channel-width dimensions. The simulation results indicate that when channel-width dimensions increase, the minimum (required) channel lengths of the transistors may also increase. When the same channel-width dimension is used for all types of transistors, the transistor in accordance with the embodiments of the present disclosure have the smallest minimum channel length. This indicates that the transistors formed in accordance with the embodiments of the present disclosure may have the smallest channel length while still maintain good channel control among the transistors simulated. Alternatively stated, when the channel-width dimension increases, the transistor formed in accordance with the embodiments of the present disclosure has better scaling capability than other types of transistors. For example, when the channel-width dimension is 6 nm. The transistor in accordance with the embodiments of the present disclosure has the minimum channel length of 6 nm, while the nanowire transistor and the FinFET have minimum channel lengths of about 9 nm and about 14 nm, respectively, which are much higher than the transistor in accordance with the embodiments of the present disclosure. The single-gate transistor has even worse scaling capability than the nanowire transistor and the FinFET.

The embodiments of the present disclosure have some advantageous features. By forming 2D (Van Der Waals) materials as the channels of transistors, the short-channel effect is minimized, and the minimum channel length of the resulting transistor may be scaled down without causing the increase in the sub-threshold swing. By adopting edge contacts with maximized area, the contact resistance of the source/drain contact is reduced.

In accordance with some embodiments of the present disclosure, a method comprises etching a dielectric layer to form a dielectric fin; depositing a transition metal dichalcogenide layer on the dielectric fin; performing a first anisotropic etching process on the transition metal dichalcogenide layer, wherein horizontal portions of the transition metal dichalcogenide layer are removed, and vertical portions of the transition metal dichalcogenide layer on sidewalls of the dielectric fin remain to form a vertical semiconductor ring; forming a gate stack on a first portion of the vertical semiconductor ring; and forming a source/drain contact plug, wherein the source/drain contact plug contacts sidewalls of a second portion of the vertical semiconductor ring. In accordance with an embodiment, the depositing the transition metal dichalcogenide layer comprises depositing a $MoS_2$ layer. In accordance with an embodiment, the method further comprises, after the forming the gate stack, depositing a contact etch stop layer and an inter-layer dielectric covering the transition metal dichalcogenide layer, and the forming the source/drain contact plug comprises performing a second anisotropic etching process to form a contact opening penetrating through the inter-layer dielectric, with the contact etch stop layer exposed to the contact opening; performing an isotropic etching process on the contact etch stop layer to reveal the transition metal dichalcogenide layer to the contact opening; and filling the contact opening with a conductive material. In accordance with an embodiment, the method further comprises forming a gate spacer on a sidewall of the gate stack, and the source/drain contact plug contacts a sidewall of the gate spacer. In accordance with an embodiment, the method further comprises forming a gate spacer, wherein sidewalls of the gate stack and the gate spacer contact each other, and the source/drain contact plug is spaced apart from the gate spacer. In accordance with an embodiment, the etching the dielectric layer to form the dielectric fin is performed using an additional dielectric layer as an etch stop layer, and the source/drain contact plug forms an interface with the vertical semiconductor ring, and wherein the interface extends from a top end of the vertical semiconductor ring to a top surface of the additional dielectric layer. In accordance with an embodiment, the transition metal dichalcogenide layer is performed using Chemical vapor deposition with $MoO_3$ powder and sulfur powder as precursors.

In accordance with some embodiments of the present disclosure, a device comprises a dielectric fin; a transition metal dichalcogenide layer on sidewalls of the dielectric fin; a gate stack on the dielectric fin and the transition metal dichalcogenide layer, wherein the gate stack contacts a first portion of a sidewall of the transition metal dichalcogenide layer; a gate spacer contacting the gate stack; and a source/drain contact plug contacting a second portion of the sidewall of the transition metal dichalcogenide layer. In accordance with an embodiment, the device further comprises a dielectric layer, with the dielectric fin being over and contacting the dielectric layer, wherein the transition metal dichalcogenide layer extends to a top surface of the dielectric layer. In accordance with an embodiment, the source/drain contact plug forms an interface with the transition metal dichalcogenide layer, and the interface extends to the top surface of the dielectric layer. In accordance with an embodiment, the dielectric fin and the dielectric layer are formed of different dielectric materials. In accordance with an embodiment, the transition metal dichalcogenide layer is a monolayer. In accordance with an embodiment, the transition metal dichalcogenide layer comprises a plurality of monolayers. In accordance with an embodiment, the transition metal dichalcogenide layer comprises $MoS_2$.

In accordance with some embodiments of the present disclosure, a device includes a dielectric layer; a dielectric fin over the dielectric layer; a two-dimensional semiconductor material forming a ring encircling, and contacting sidewalls of, the dielectric fin; a gate dielectric contacting top surfaces of the dielectric fin and the dielectric layer, and further contacting the two-dimensional semiconductor material; a gate electrode over the gate dielectric, wherein the two-dimensional semiconductor material comprises a source portion and a drain portion on opposing sides of the gate electrode; and a source/drain contact plug contacting one of the source portion and the drain portion of the two-dimensional semiconductor material. In an embodiment, each of the source portion and the drain portion contacts three sidewalls of the dielectric fin to form a U-shaped structure. In accordance with an embodiment, the two-dimensional semiconductor material is free from horizontal portions parallel to an interface between the dielectric layer and the dielectric fin. In accordance with an embodiment, the two-dimensional semiconductor material comprises a transition metal dichalcogenide layer. In accordance with an embodiment, the source/drain contact plug and the two-dimensional semiconductor material form an interface extending to a top surface of the dielectric layer. In accordance with an embodiment, the dielectric layer and the dielectric fin are formed of different dielectric materials.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a dielectric fin;
   a transition metal dichalcogenide layer on sidewalls of the dielectric fin, wherein the transition metal dichalcogenide layer comprises a 2D material;
   a gate stack on the dielectric fin and the transition metal dichalcogenide layer, wherein the gate stack contacts a first portion of a sidewall of the transition metal dichalcogenide layer;
   a gate spacer contacting the gate stack; and
   a source/drain contact plug contacting a second portion of the sidewall of the transition metal dichalcogenide layer, wherein the source/drain contact plug is free of the 2D material.

2. The device of claim 1 further comprising a dielectric layer, with the dielectric fin being over and contacting the dielectric layer, wherein the transition metal dichalcogenide layer extends to a top surface of the dielectric layer.

3. The device of claim 2, wherein the source/drain contact plug forms an interface with the transition metal dichalcogenide layer, and the interface extends to the top surface of the dielectric layer.

4. The device of claim 2, wherein the dielectric fin and the dielectric layer are formed of different dielectric materials.

5. The device of claim 1, wherein the transition metal dichalcogenide layer is a monolayer.

6. The device of claim 1, wherein the transition metal dichalcogenide layer comprises a plurality of monolayers.

7. The device of claim 1, wherein the transition metal dichalcogenide layer comprises $MoS_2$.

8. A device comprising:
   a dielectric layer;
   a dielectric fin over the dielectric layer;
   a two-dimensional semiconductor material forming a ring encircling, and contacting sidewalls of, the dielectric fin;
   a gate dielectric contacting top surfaces of the dielectric fin and the dielectric layer, and further contacting the two-dimensional semiconductor material;
   a gate electrode over the gate dielectric, wherein the two-dimensional semiconductor material comprises a source portion and a drain portion on opposing sides of the gate electrode; and
   a source/drain contact plug contacting one of the source portion and the drain portion of the two-dimensional semiconductor material.

9. The device of claim 8, wherein each of the source portion and the drain portion contacts three sidewalls of the dielectric fin to form a U-shaped structure.

10. The device of claim 8, wherein the two-dimensional semiconductor material is free from horizontal portions parallel to an interface between the dielectric layer and the dielectric fin.

11. The device of claim 8, wherein the two-dimensional semiconductor material comprises a transition metal dichalcogenide layer.

12. The device of claim 8, wherein the source/drain contact plug and the two-dimensional semiconductor material form an interface extending to a top surface of the dielectric layer.

13. The device of claim 8, wherein the dielectric layer and the dielectric fin are formed of different dielectric materials.

14. A device comprising
   a dielectric region;
   a two-dimensional semiconductor material, wherein a first sidewall of the two-dimensional semiconductor material contacts the dielectric region to form a first vertical interface;
   a gate dielectric extending on tops of the dielectric region and the two-dimensional semiconductor material, and contacts a second sidewall of the two-dimensional semiconductor material;
   a gate electrode on the gate dielectric;
   a source/drain contact plug contacting a third sidewall of the two-dimensional semiconductor material to form a second vertical interface, wherein the first sidewall and the third sidewall of the two-dimensional semiconductor material are opposite sidewalls; and a dielectric layer underlying and in contact with both of the dielectric region and the two-dimensional semiconductor material, wherein the source/drain contact plug comprises a bottom surface contacting a top surface of the dielectric layer.

15. The device of claim 14, wherein the source/drain contact plug contacts a top surface of the dielectric region.

16. The device of claim 15 further comprising a gate spacer, wherein the source/drain contact plug further contacts an additional sidewall of the gate spacer.

17. The device of claim 14, wherein the two-dimensional semiconductor material comprises a transition metal dichalcogenide material.

18. The device of claim 14, wherein the two-dimensional semiconductor material is a mono layer material.

19. The device of claim 14, wherein the two-dimensional semiconductor material comprises a plurality of monolayers.

20. The device of claim 14, wherein the dielectric region and the dielectric layer are formed of different dielectric materials.

* * * * *